US009585261B2

(12) United States Patent
Tateoka et al.

(10) Patent No.: US 9,585,261 B2
(45) Date of Patent: *Feb. 28, 2017

(54) MANUFACTURING METHOD OF MULTILAYER PRINTED WIRING BOARD (75) Inventors: Ayumu Tateoka, Saitama (JP); Shinichi Obata, Saitama (JP); Toshiyuki Shimizu, Saitama (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 315 days.

This patent is subject to a terminal disclaimer.

(21) Appl. No.: 14/008,034

(22) PCT Filed: Mar. 29, 2012

(86) PCT No.: PCT/JP2012/058338
§ 371 (c)(1),
(2), (4) Date: Nov. 1, 2013

(87) PCT Pub. No.: WO2012/133637
PCT Pub. Date: Oct. 4, 2012

(65) Prior Publication Data
US 2014/0096381 A1    Apr. 10, 2014

(30) Foreign Application Priority Data

Mar. 30, 2011    (JP) .................. 2011-075419

(51) Int. Cl.
*H05K 3/30*    (2006.01)
*H05K 3/46*    (2006.01)
*H05K 3/02*    (2006.01)

(52) U.S. Cl.
CPC .......... *H05K 3/4652* (2013.01); *H05K 3/022* (2013.01); *H05K 3/4658* (2013.01); *H05K 3/4682* (2013.01); *Y10T 29/49155* (2015.01)

(58) Field of Classification Search
CPC .......... H05K 3/007; H05K 3/022; H05K 3/10; H05K 3/4602; H05K 3/4611;
(Continued)

(56) References Cited

U.S. PATENT DOCUMENTS 6,143,116 A * 11/2000 Hayashi et al. .............. 156/233
7,223,687 B1 * 5/2007 Ho et al. ....................... 438/622
(Continued)

FOREIGN PATENT DOCUMENTS

CN    1466517 A    1/2004
CN    101257775 A    9/2008
(Continued)

OTHER PUBLICATIONS

U.S. Appl. No. 14/008,038 to Ayumu Tateoka et al., filed Sep. 27, 2013.
(Continued)

*Primary Examiner* — Paul D Kim
(74) *Attorney, Agent, or Firm* — Greenblum Bernstein, P.L.C.

(57) ABSTRACT

A manufacturing method of a multilayer printed wiring board in which a copper foil with carrier foil consists of at least four layers, a carrier foil/a release layer/a heat-resistant metal layer/a copper foil layer is used; a supporting substrate is manufactured by laminating an insulating layer constituting material on the surface of the copper foil layer constituting the copper foil with carrier foil; a supporting substrate with build-up wiring layer is manufactured by forming a build-up wiring layer on the surface of the carrier foil constituting the copper foil with carrier foil in the supporting substrate; the resulted supporting substrate with build-up wiring layer is separated at the release layer to manufacture
(Continued)

a multilayered laminate; the resulted multilayered laminate is processed a necessary procedures to manufacture a multilayer printed wiring board.

9 Claims, 10 Drawing Sheets

(58) Field of Classification Search
CPC ............... H05K 3/4658; H05K 3/4682; Y10T 29/49126; Y10T 29/49128; Y10T 29/49155; Y10T 29/49162; Y10T 29/49208
USPC ..... 29/831, 832, 842, 846, 852, 866; 216/13
See application file for complete search history.

(56) References Cited

U.S. PATENT DOCUMENTS

| | | | |
|---|---|---|---|
| 7,297,562 | B1 † | 11/2007 | Huemoeller |
| 7,771,841 | B2 | 8/2010 | Suzuki et al. |
| 7,985,488 | B2 | 7/2011 | Suzuki et al. |
| 8,176,627 | B2 | 5/2012 | Kobayashi |
| 9,066,459 | B2 * | 6/2015 | Tateoka et al. |
| 2004/0038049 | A1 | 2/2004 | Suzuki et al. |
| 2004/0067377 | A1 † | 4/2004 | Sugimoto |
| 2004/0121178 | A1 | 6/2004 | Suzuki et al. |
| 2005/0249927 | A1 † | 11/2005 | Suzuki |
| 2007/0207337 | A1 | 9/2007 | Nagatani |
| 2008/0202661 | A1 † | 8/2008 | Kobayashi |
| 2011/0014453 | A1 | 1/2011 | Ohigashi |
| 2012/0181708 | A1 * | 7/2012 | Furutani et al. ............... 257/787 |

FOREIGN PATENT DOCUMENTS

| | | | |
|---|---|---|---|
| JP | 2000309898 | A * | 11/2000 |
| JP | 2002-292788 | | 10/2002 |
| JP | 2002292788 | A † | 10/2002 |
| JP | 3466506 | B2 † | 11/2003 |
| JP | 2005-262506 | | 9/2005 |
| JP | 2007-165513 | | 6/2007 |
| JP | 2007-186782 | | 7/2007 |
| JP | 2008-218450 | | 9/2008 |
| JP | 4273895 | B2 † | 6/2009 |
| JP | 2010-092907 | | 4/2010 |
| JP | 2010-222657 | | 10/2010 |
| TW | 201004500 | A1 | 1/2010 |
| TW | I338543 | B1 | 3/2011 |

OTHER PUBLICATIONS

Japan Office action, dated Apr. 8, 2014 along with an english translation thereof.
Taiwan Office action, dated Jan. 8, 2014 along with an english translation thereof.
Office Action issued in Chinese family member Patent Appl. No. 201280014060.8, dated Aug. 17, 2015, along with an English translation thereof.

* cited by examiner
† cited by third party

MANUFACTURING METHOD OF MULTILAYER PRINTED WIRING BOARD

TECHNICAL FIELD

The present invention relates to a manufacturing method of a multilayer printed wiring board and a multilayer printed wiring board obtained by using the manufacturing method. In particular, the present invention relates to a manufacturing method of a multilayer printed wiring board employing a coreless build-up method in a multilayer processing of a printed wiring board.

BACKGROUND ART

Recently, multilayer structure has been widely employed in printed wiring boards for miniaturization of the printed wiring boards by increased wiring density of printed wiring boards. Multilayer printed wiring boards are used in many mobile electronic devices to achieve downsizing. Then, multilayer printed wiring boards are required both further thickness reduction in interlayer insulating layers and further weight reduction.

As a technology which satisfies such requirements, a manufacturing method employing the coreless build-up method disclosed in Patent Document 1 has been used. The coreless build-up method is a manufacturing method for forming a multilayer structure without using the so-called core substrate, i.e. the method alternately laminate layers of an insulating layer constituting material consists of only a polymer material and a conductor layer. In the market, utilization of a copper foil with a peelable-type carrier in the coreless build-up method has been introduced to make separation between the multilayer printed wiring board and the supporting substrate easy. Then, the following products are available as the copper foil with carrier used in the coreless build-up method.

For example, the copper foil with carrier disclosed in Patent Document 2 is used in the coreless build-up method. In Patent Document 2, an ultra-thin copper foil with carrier having a layer structure consists of "a carrier foil, a diffusion prevention layer, a release layer and an ultra-thin copper foil" is used to achieve the objects; to provide an ultra-thin copper foil with carrier without blister in the releasing interface, low carrier peel, friendly to the environment and easy carrier foil releasing from the ultra-thin copper foil after keeping in a high temperature environment; and to provide a printed wiring board backed up by stable manufacturing quality as a base material for a printed wiring board used in fine pattern application using the ultra-thin copper foil with carrier. In the ultra-thin copper foil with carrier, the release layer consists of a metal A for ensurance of releasability and a metal B for easy plating of the ultra-thin copper foil, wherein the release layer consists of the metal components in which the content [a] of the metal A and the content [b] of the metal B in the release layer satisfy the ratio $[a]/[a+b]*100$ of 10 to 70%.

Figure 4:
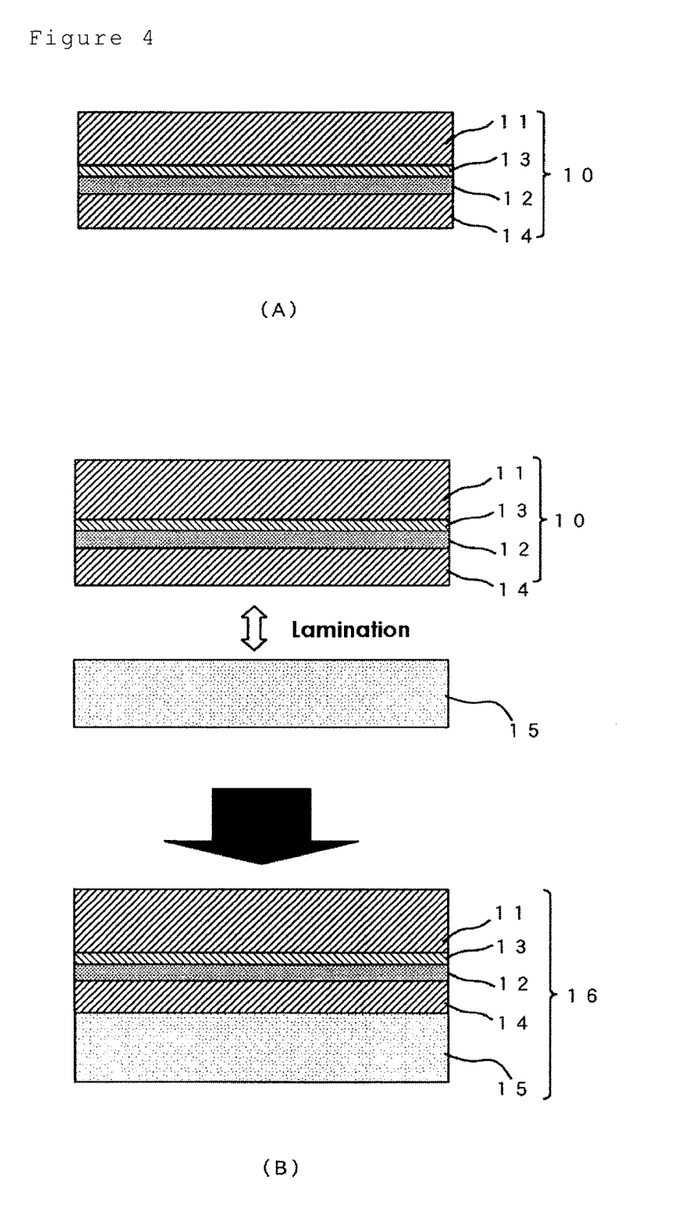
FIG. 4 is a diagram illustrating a manufacturing flow of a manufacturing method of a multilayer printed wiring board according to the combined conventional technologies.
Figure 5:
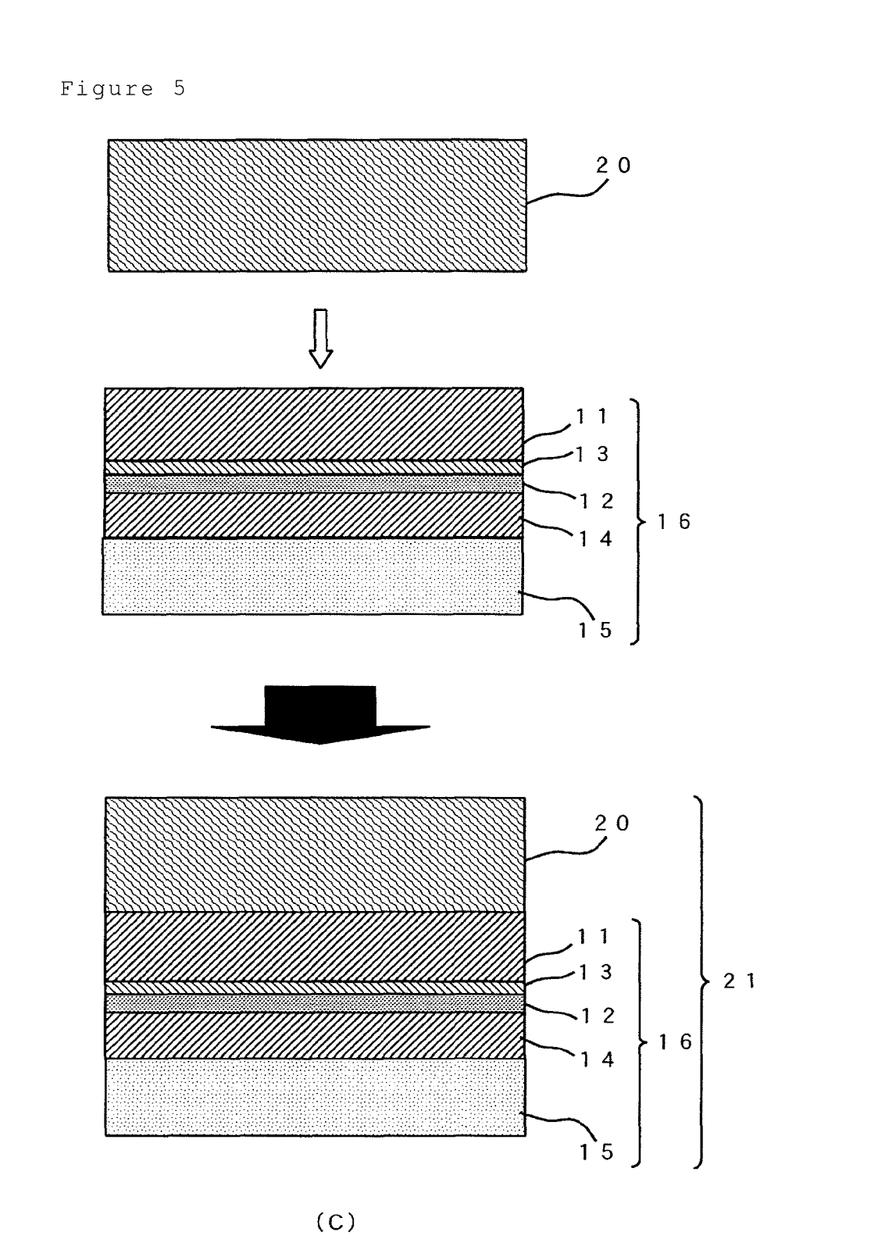
FIG. 5 is a diagram illustrating a manufacturing flow of a manufacturing method of a multilayer printed wiring board according to the combined conventional technologies.
Figure 6:
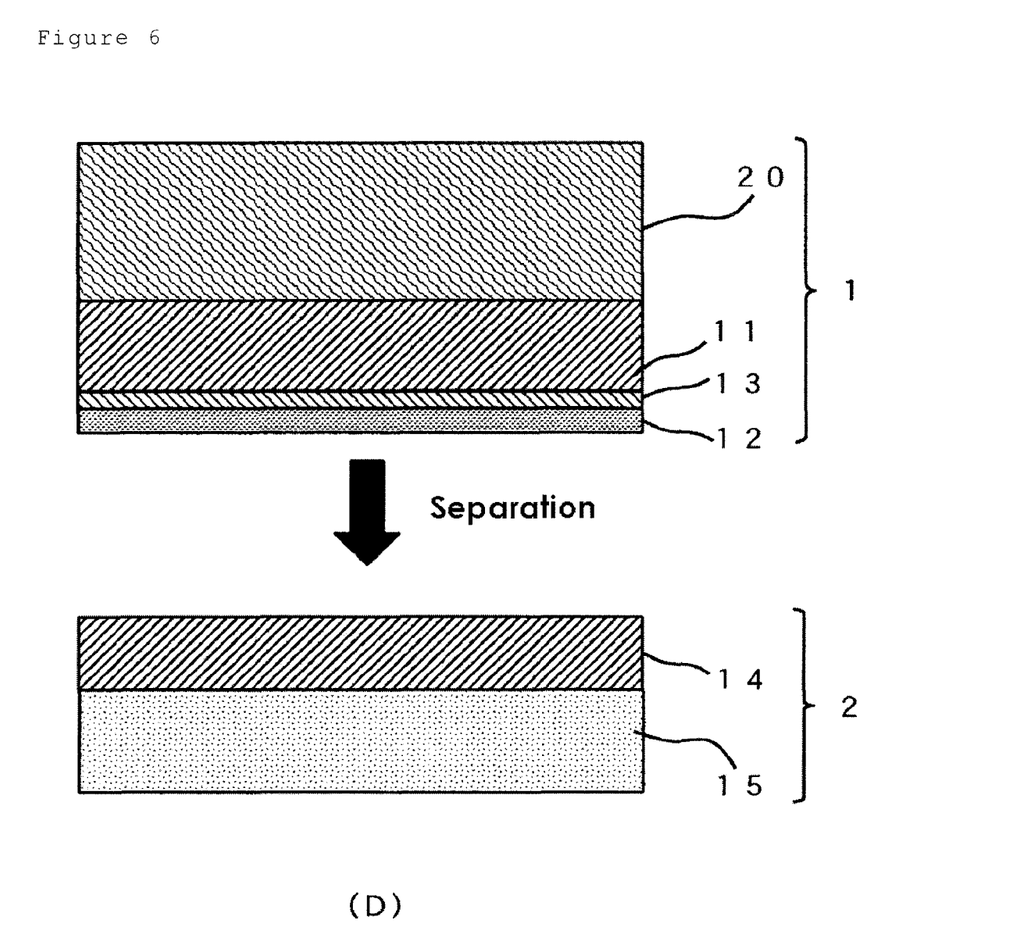
FIG. 6 is a diagram illustrating a manufacturing flow of a manufacturing method of a multilayer printed wiring board according to the combined conventional technologies.

In the manufacturing of a printed wiring board employing the coreless build-up method disclosed in Patent Document 1, a printed wiring board can be manufactured by employing the coreless build-up method using the ultra-thin copper foil with carrier disclosed in Patent Document 2. In this method, the manufacturing process of the printed wiring board employing the coreless build-up method is shown in FIG. 4 to FIG. 6. As is apparent in the process, after the build-up layer to be an actual board later is formed on the supporting substrate, the supporting substrate and the build-up layer are separated at the release layer in the ultra-thin copper foil with a peelable-type carrier provided between the supporting substrate and the build-up layer. In this step, in the ultra-thin copper foil with carrier, the diffusion prevention layer (heat-resistant metal layer) which prevents diffusion of the release layer components exists on the carrier side to ensure the separation at the release layer even after loading a high temperature in lamination.

DOCUMENTS CITED

Patent Documents

[Patent Document 1] Japanese Patent Laid-Open No. 2007-165513
[Patent Document 2] Japanese Patent Laid-Open No. 2007-186782

SUMMARY OF INVENTION

Problems to be Solved

However, as is apparent in FIG. 6(D), when a multilayer printed wiring board is manufactured by employing the coreless build-up method in which the build-up layer is laminated on the carrier side of the ultra-thin copper foil with carrier having the layer structure described above, the heat-resistant metal layer remains on the surface of the build-up layer after separation between the supporting substrate and the build-up layer.

When the heat-resistant metal layer remains on the surface of the build-up layer as described above, removal of the heat-resistant metal layer is indispensable before processing to manufacture the multilayer printed wiring board.

Accordingly, the market has requested a technology in which removal of the heat-resistant metal layer is dispensable even when multilayer printed wiring boards are manufactured by employing the coreless build-up method using a copper foil with carrier foil.

Means to Solve the Problem

Then, the present inventors have solved the problem by adopting the concept described below as a result of a diligent study.

Manufacturing method of a multilayer printed wiring board: A manufacturing method of a multilayer printed wiring board employing a coreless build-up method using a copper foil with carrier foil according to the present invention is characterized in including the following steps.

Step for preparation of a copper foil with carrier foil: A step for preparation of a copper foil with carrier foil consists of at least four layers of a carrier foil/a release layer/a heat-resistant metal layer/a copper foil layer and satisfies the relation [thickness of the carrier foil]=>[thickness of the copper foil layer];

Step for manufacturing a supporting substrate: A step for manufacturing a supporting substrate consists of the copper foil with carrier foil and an insulating layer constituting material by laminating the insulating layer constituting material to the copper foil layer surface of the copper foil with carrier foil;

Step for manufacturing a build-up wiring layer: A step for manufacturing a supporting substrate with a build-up wiring layer by forming a build-up wiring layer on the carrier foil surface in the supporting substrate; Step for separation of the supporting substrate with the build-up wiring layer: A step for manufacturing a multilayered laminate by separating the supporting substrate with the build-up wiring layer at the release layer in the supporting substrate; and Step for manufacturing a multilayer printed wiring board: A step for manufacturing a multilayer printed wiring board by processing necessary procedures on the multilayered laminate.

In the manufacturing method of a multilayer printed wiring board according to the present application, it is preferable that the copper foil with carrier foil is applied at least one or more treatment selected from a roughening treatment, a rust-proofing treatment and a coupling agent treatment on at least one surface of each of the carrier foil and the copper foil layer.

In the manufacturing method of a multilayer printed wiring board according to the present application, it is also preferable that the heat-resistant metal layer constituting the copper foil with carrier foil is formed by using nickel or a nickel alloy.

In the manufacturing method of a multilayer printed wiring board according to the present application, it is also preferable that the release layer constituting the copper foil with carrier foil is formed by using one or mixture of organic substance selected from the group consists of a nitrogen-containing organic compound, a sulfur-containing organic compound and a carboxylic acid.

Advantages of the Invention

By adopting the manufacturing method of a multilayer printed wiring board according to the present application, the heat-resistant metal layer which is hard to etch does not remain on the surface of a multilayered laminate including a build-up wiring layer manufactured by employing the coreless build-up method using a copper foil with carrier foil, and hence the step for removing the heat-resistant metal layer is dispensable. Therefore, the manufacturing method of a multilayer printed wiring board according to the present application is useful in the field of manufacturing a multilayer printed wiring board.

PREFERRED EMBODIMENTS OF THE INVENTION

Hereinafter, preferred embodiments of the manufacturing method of a multilayer printed wiring board according to the present application and preferred embodiments of the multilayer printed wiring board according to the present application will be described in turn.

<Embodiment of Manufacturing Method for Multilayer Printed Wiring Board>

The manufacturing method of a multilayer printed wiring board according to the present application is a manufacturing method of a multilayer printed wiring board employing a coreless build-up method using a copper foil with carrier foil characterized in including the following steps.

Figure 1:
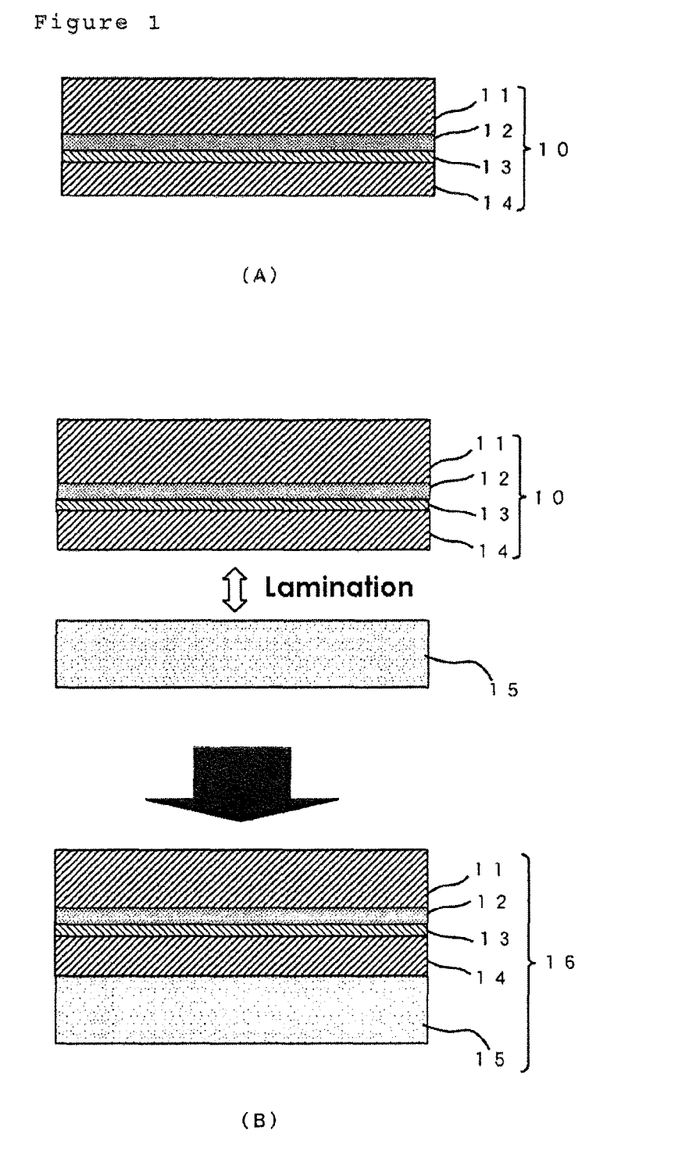
FIG. 1 is a diagram illustrating a manufacturing flow of the manufacturing method of a multilayer printed wiring board according to the present application.

The step for preparation of a copper foil with carrier foil: The copper foil with carrier foil 10 to be prepared should consists of at least four layers of a carrier foil 11/a release layer 12/a heat-resistant metal layer 13/a copper foil layer 14. That is, basic layer structure of the copper foil with carrier foil includes a release layer 12 provided on the surface of the carrier foil 11, a heat-resistant metal layer 13 provided on the surface of the release layer 12 and a copper foil layer 14 provided on the heat-resistant metal layer 13. Further, the relation [thickness of the carrier foil]=>[thickness of the copper foil layer] is satisfied. FIG. 1(A) shows the basic layer structure of the copper foil with carrier foil 10. Hereinafter, each member constituting the copper foil with carrier foil 10 will be described.

As the carrier foil 11 constituting the copper foil with carrier foil 10, foils including a copper foil, a copper alloy foil, an aluminum foil, an aluminum alloy foil and a stainless steel foil can be used. However, in consideration of the economic efficiency and the recyclability as wastes, it is preferable to use a copper foil. The copper foil may be either an electro-deposited copper foil or a rolled copper foil. The thickness of the carrier foil is preferable to be 7 µm to 35 µm. The thickness of the carrier foil of less than 7 µm is not preferable because severe defectives including wrinkles and folds may generate in the manufacturing process of the copper foil with carrier foil sequentially provide the release layer 12, the heat-resistant metal layer 13 and the copper foil layer 14 on the surface of the carrier foil 11. In contrast, when the thickness of the carrier foil 11 exceeds 35 µm, no particular problems occur. However, even when the thickness of the carrier foil 11 is made further thicker, no significant change occurs in the effect for preventing generation of the defectives including wrinkles and folds in the manufacturing process of the copper foil with the carrier foil 10, and only the prices of the products increase without providing any particular advantages. Note that the carrier foil is thicker than the copper foil layer in general but the present invention satisfies the relation [thickness of the carrier foil]=>[thickness of the copper foil layer].

The release layer 12 constituting the copper foil with carrier foil 10 may be formed by using either an organic substance or an inorganic material. When the release layer 12 consists of an inorganic material, it is preferable to use chromium, nickel, molybdenum, tantalum, vanadium, tungsten and cobalt, or the oxides of these metals. However, in consideration of the releasing stability in the release layer 12 after heat treatment including hot pressing for a long time in the manufacturing of the build-up wiring layer 20 described later, the release layer 12 is preferable to be an organic release layer formed by using an organic substance. The organic release layer is preferable to be formed by using one or mixture of two or more of an organic substance selected from the group consists of a nitrogen-containing organic compound, a sulfur-containing organic compound and a carboxylic acid.

The release strength between the carrier foil and the copper foil layer is preferable to be 5 g/cm to 80 g/cm. Release strength of less than 5 g/cm is not preferable because of possible drawback of separation between the carrier foil and the copper foil layer in the step for manufacturing the build-up wiring layer described later. In contrast, release strength exceeding 80 g/cm is not preferable also because of difficulty in separation of the supporting substrate with build-up wiring layer at the release layer in the supporting substrate in the step for separation of supporting substrate with a build-up wiring layer described later.

The heat-resistant metal layer 13 constituting the copper foil with carrier foil 10 is provided for preventing "the counter diffusion between the carrier foil 11 and the copper foil layer 14" which occurs in a high temperature or a prolonged hot pressing. Then, the seizing between the carrier foil 11 and the copper foil layer 14 is prevented to ensure the easy releasing between the carrier foil 11 and the copper foil layer 14. For the heat-resistant metal layer 13, it is preferable to use a metal or an alloy selected from the group consists of molybdenum, tantalum, tungsten, cobalt and nickel, and various alloys including these metal components. However, it is more preferable to form the heat-resistant metal layer 13 by using nickel or a nickel alloy. In consideration of formation of a heat-resistant metal layer 13 on the release layer 12 provided on the surface of the carrier foil 11 employing a wet film formation method excellent in economic efficiency such as an electroless plating method or an electro-plating method, a nickel layer or a nickel alloy layer is excellent in precision of film thickness evenness and is stable in heat resistance also. Note that, a dry film formation method including a sputtering vapor deposition method and a chemical vapor deposition method is also available for the formation of the heat-resistant metal layer 13.

The copper foil layer 14 constituting the copper foil with carrier foil 10 is preferable to be formed by a wet film formation method including an electroless-copper plating method and an electro-copper plating method, a dry film formation method including a sputtering vapor deposition method and a chemical vapor deposition method, or a combination of two or more of these film formation methods. In the electroless-copper plating method and the electro-copper plating method, there is no particular limitation. For example, a thin copper layer may be formed by the electroless-copper plating method, and then the copper layer may be stacked by the electro-copper plating method to be an intended plated copper thickness. In the electro-copper plating method, a plating solution suitable for a copper ion supply source including a copper sulfate-based copper plating solution and a copper pyrophosphate-based copper plating solution can be used; however, the specific electroplating method is not particularly limited.

Further according to need, it is also preferable to apply one or more treatment selected from a roughening treatment, a rust-proofing treatment and a coupling agent treatment on the surfaces of the copper foil layer 14 and the carrier foil 11 depending on recommendation in the intended application. In particular, it is preferable to apply at least one treatment selected from the roughening treatment, the rust-proofing treatment and the silane coupling agent treatment on the surface of the copper foil layer 14 to be bonded to the insulating layer constituting material 15, for the purpose to ensure a sufficient adhesion to the insulating layer constituting material 15. Note that, with respect to the surface of the carrier foil 11, the side for formation of the build-up wiring layer, it is preferable to apply a surface treatment depending on the method for manufacturing the build-up wiring layer 20.

The step for manufacturing a supporting substrate: In this step, the insulating layer constituting material 15 is laminated on the surface of the copper foil layer 14 constituting the copper foil with carrier foil 10 to manufacture the supporting substrate 16 consists of the copper foil with carrier foil 10 and the insulating layer constituting material 15 as shown in FIG. 1(B). With respect to the conditions and the methods for lamination in this step, all of the conditions and the methods used for laminating the copper foil and the insulating layer constituting material in manufacturing of a conventional printed wiring board are available. Next, there is no limitation in the insulating layer constituting material, widely and generally known insulating resin substrates can be used. Note that an insulating layer constituting material in a semi-cured state and an insulating layer constituting material after fully cured by heating are not apparently distinguished from each other in the present description and the drawings, and the same symbol number (15) is used for these insulating layer constituting materials in the drawings.

Figure 2:
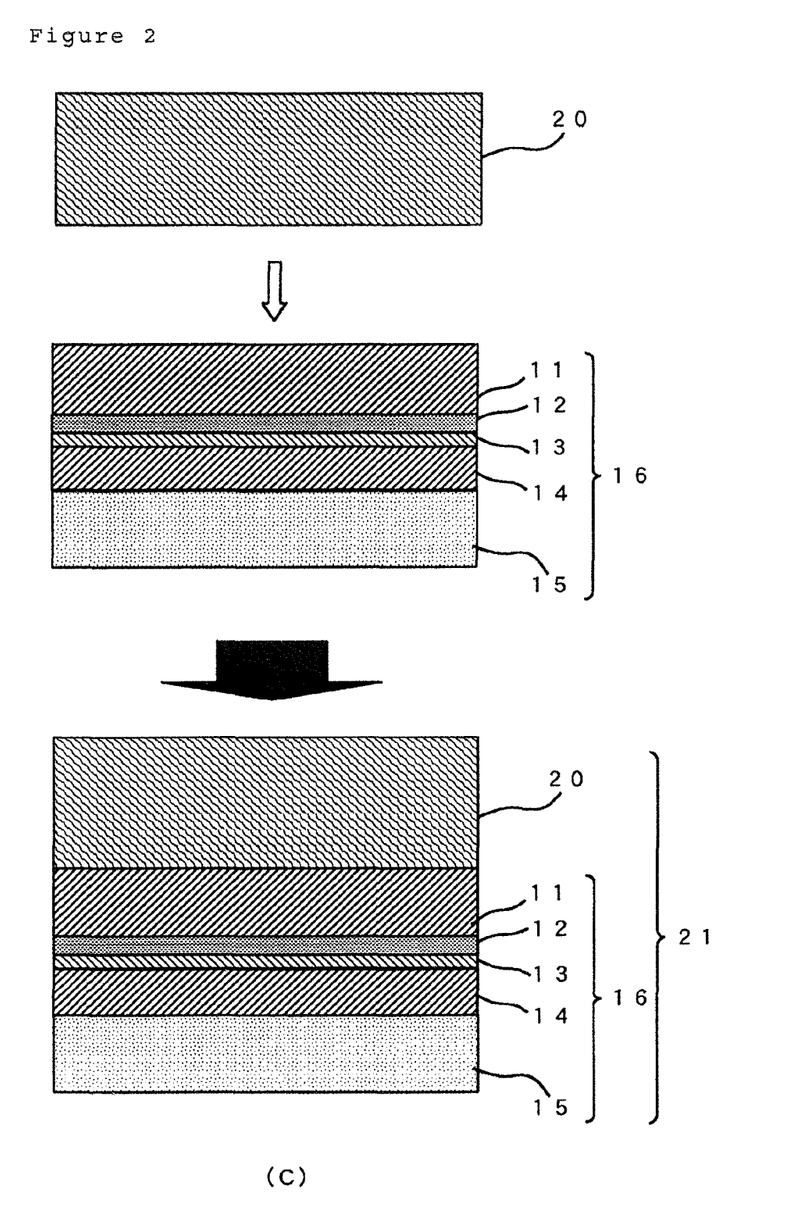
FIG. 2 is a diagram illustrating a manufacturing flow of the manufacturing method of a multilayer printed wiring board according to the present application.

The step for manufacturing a build-up wiring layer: In this step, the build-up wiring layer 20 is provided on the surface of the carrier foil 11 constituting the copper foil with carrier foil 10 in the supporting substrate 16 to manufacture the supporting substrate with the build-up wiring layer 21 as shown in FIG. 2(C). With respect to the coreless build-up method employed in this step, it is not particularly limited. The build-up wiring layer 20 consists of alternately laminated insulating layers and wiring layers both not-illustrated.

In the step for manufacturing a build-up wiring layer, a first layer of the build-up wiring layer may be formed as follows. For example, an insulating resin layer may be formed on the surface of the carrier foil 11 by laminating a resin film or by coating a resin composition on the surface of the carrier foil 11 in the supporting substrate 16. When a resin film is used for formation of the insulating resin layer, the inner layer wiring interlayer-connected to the carrier foil 11 may be formed through laminating a metal foil such as a copper foil on the surface of the resin film by hot pressing at the same time followed by formation of via holes for interlayer connection according to need followed by etching the metal foil. Alternatively, the method may be available in which only a resin film is laminated on the surface of the carrier foil 11 in the supporting substrate 16, and then an inner layer wiring pattern may be formed on the surface of the resin film by the semi-additive method. The above-described operations for manufacturing the build-up wiring layer may be repeated plural times according to need and the repeated operation results the supporting substrate with a multilayered build-up wiring layer 21.

Figure 7:
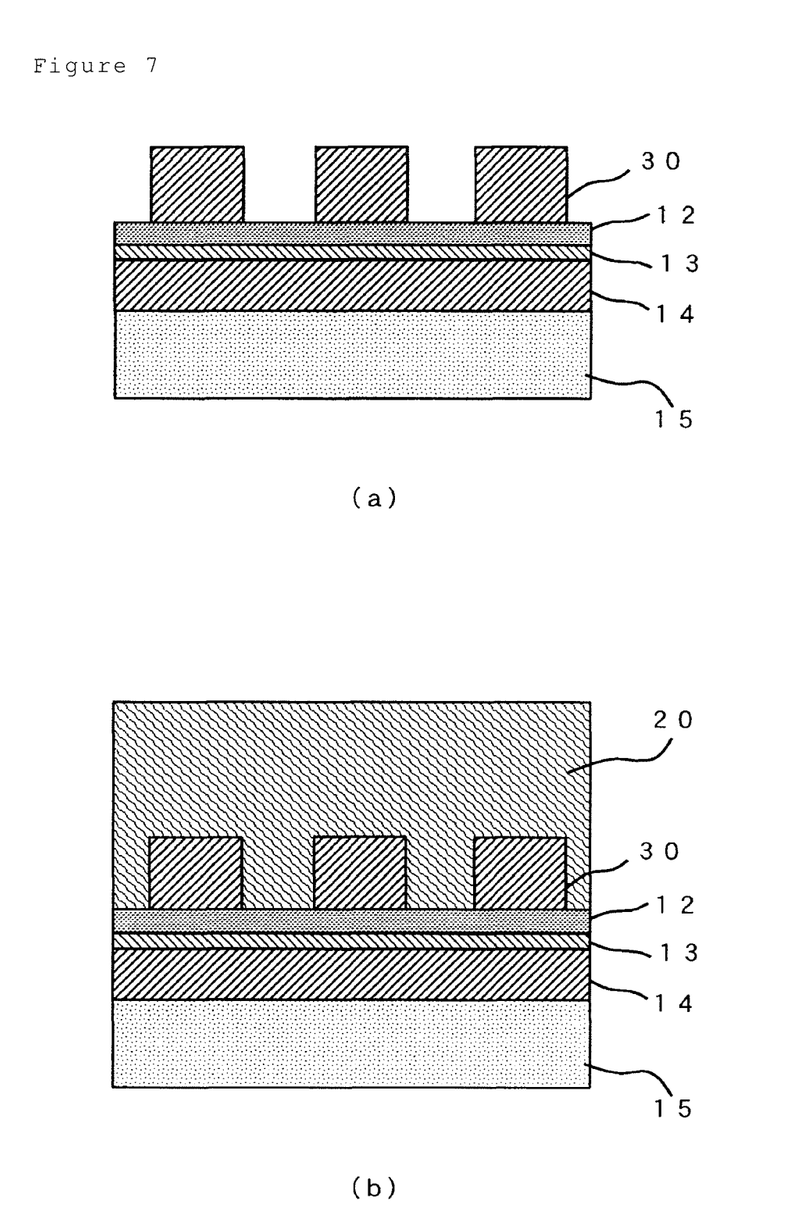
FIG. 7 is a schematic diagram exemplifying a manufacturing process of a multilayer printed wiring board.

In the step for manufacturing a build-up wiring layer, a method shown in FIG. 7 may be also available. From the state shown in FIG. 1(B), the carrier foil 11 is etched to form a wiring to obtain the state including an outer layer wiring 30 shown in FIG. 7(a). Then, the state shown in FIG. 7(b) may be obtained by forming a build-up wiring layer 20 on the surface where the wiring is formed.

Figure 8:
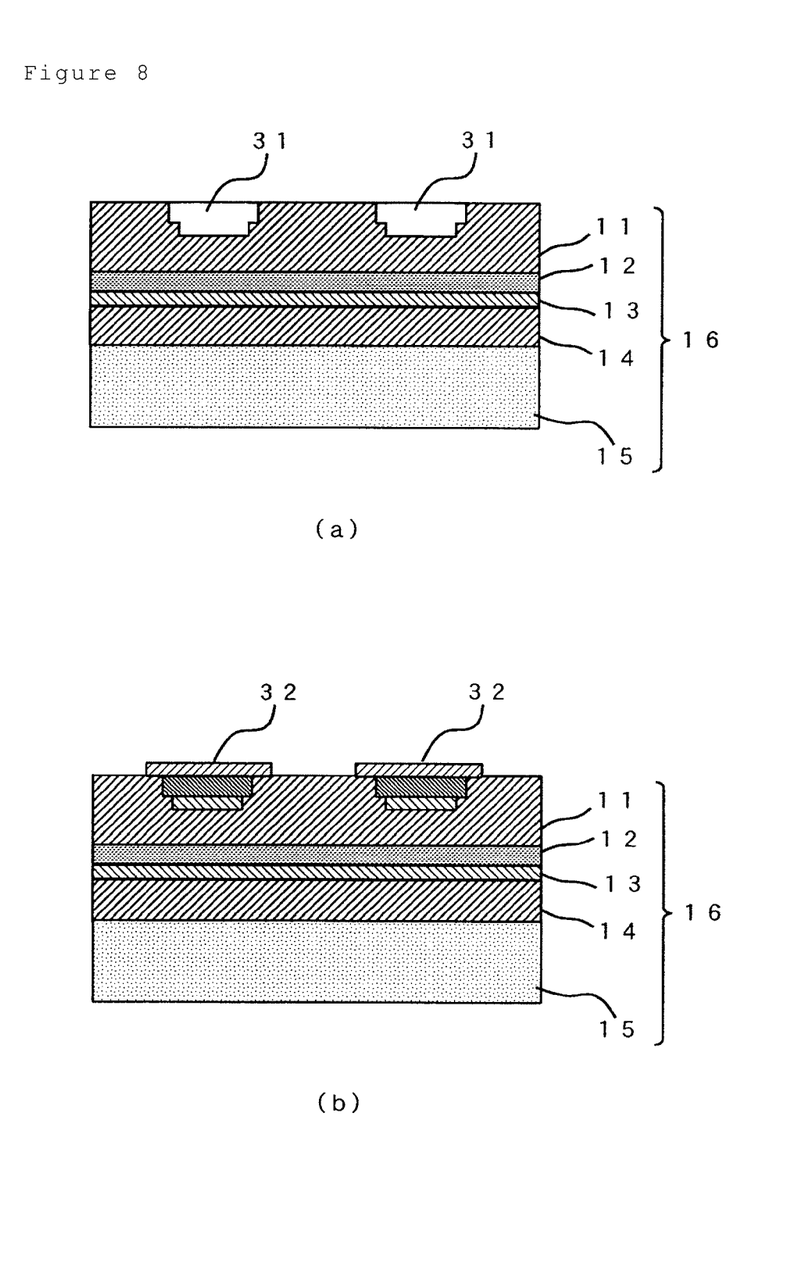
FIG. 8 is a schematic diagram exemplifying a manufacturing process of a multilayer printed wiring board.
Figure 9:
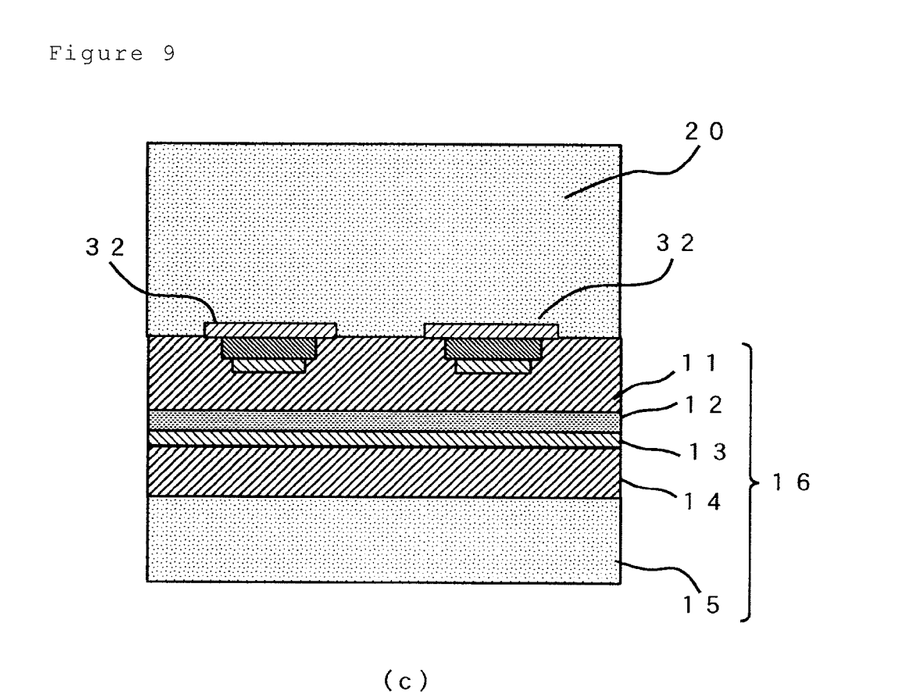
FIG. 9 is a schematic diagram exemplifying a manufacturing process of a multilayer printed wiring board.

In the step for manufacturing a build-up wiring layer, the method shown in FIG. 8 and FIG. 9 may be available. From the state shown in FIG. 1(B), the carrier foil 11 is etched as shown in FIG. 8(a) to form the housing recesses 31 for Ni—Au pads and passive components. Then, after providing Ni—Au pads and passive components in the housing recesses 31, the state shown in FIG. 8(b) is obtained. Further, the state shown in FIG. 9(c) may be obtained by subsequently forming the build-up wiring layer 20 on the surface where passive components are mounted.

Figure 3:
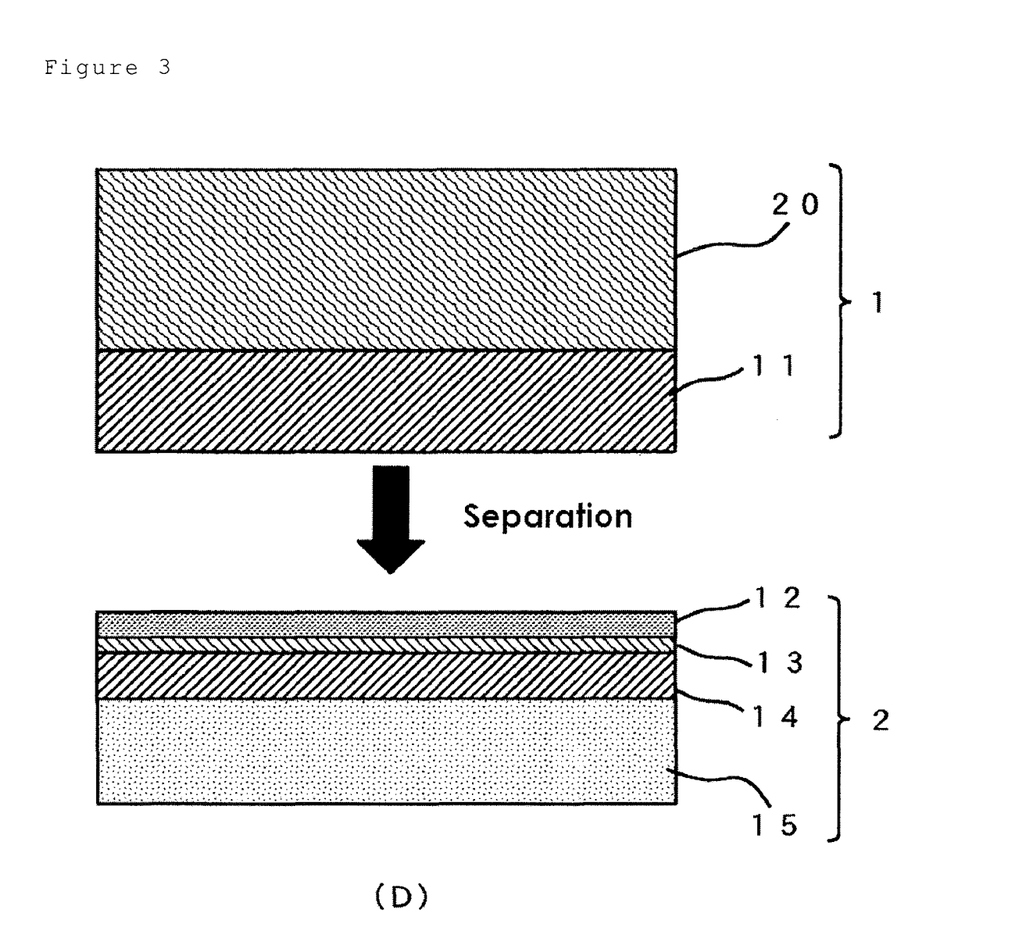
FIG. 3 is a diagram illustrating a manufacturing flow of the manufacturing method of a multilayer printed wiring board according to the present application.

The step for separation of a supporting substrate with a build-up wiring layer: In this step, a multilayered laminate 1 is manufactured by separating the supporting substrate with a build-up wiring layer 21 at the release layer 12 in the supporting substrate 16, and removing a separated substrate 2 as shown in FIG. 3(D). The multilayered laminate 1 is a laminate in which the build-up wiring layer 20 and the carrier foil 11 which constitutes the supporting substrate 16 adhere to each other.

The step for manufacturing a multilayer printed wiring board: In this step, a multilayer printed wiring board not illustrated is manufactured by processing necessary procedures on the multilayered laminate 1. The necessary procedures are not particularly limited; the necessary procedures may be all the procedures used in the manufacturing of the printed wiring board including various types of plating, etching and resist formation. The processing methods included in the category may be different methods depending on an application of the multilayer printed wiring boards, hence a restrictive description on processing methods is difficult, and it is apparent that any of restrictive description does not make sense.

Figure 10:
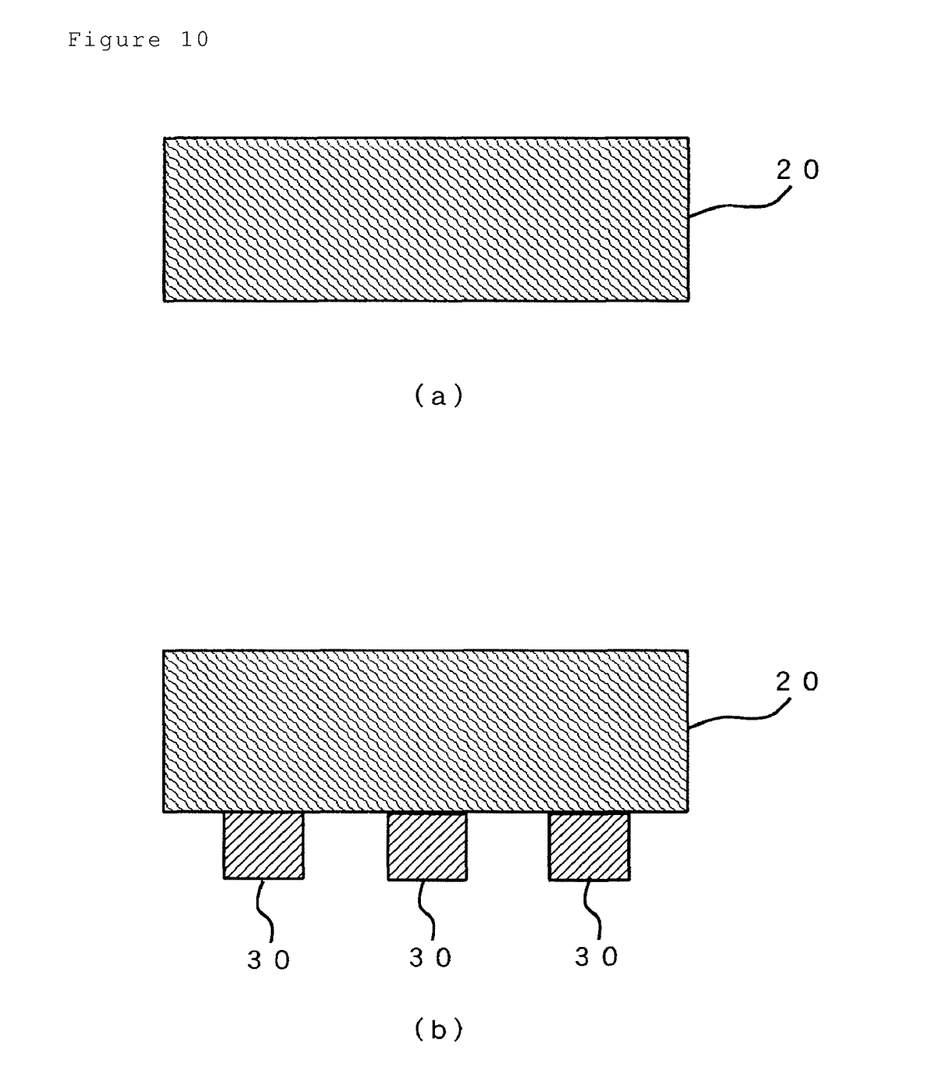
FIG. 10 is a schematic diagram exemplifying a manufacturing process of a multilayer printed wiring board.

As an example of the processing methods, a method shown in FIG. 10 may be also employed. From the state shown in FIG. 3(D), the state shown in FIG. 10(a) is obtained after fully etching the carrier foil 11. After the state shown in FIG. 10(a) is obtained, the multilayer printed wiring board may be manufactured by processing various necessary procedures. Alternatively, from the state shown in FIG. 3(D), the state shown in FIG. 10(b) may be obtained through etching process employing the subtractive method carried out after providing an etching resist layer on the surface of the carrier foil 11 to form the outer layer wiring 30, and further processing various necessary procedures, the multilayer printed wiring board may be manufactured.

INDUSTRIAL APPLICABILITY

By adopting the manufacturing method of a multilayer printed wiring board according to the present application, no heat-resistant metal layer which is hard to etch remains on the surface of the resulted multilayered laminate even when a multilayered laminate including a build-up layer is manufactured by employing a coreless build-up method using a copper foil with carrier foil. So, the step for removing the heat-resistant metal layer is dispensable in the manufacturing method of a multilayer printed wiring board according to the present application, and the multilayer printed wiring board is manufactured in low cost.

SYMBOL LIST

1 Multilayered laminate
2 Separated substrate
10 Copper foil with carrier foil
11 Carrier foil
12 Release layer
13 Heat-resistant metal layer (diffusion prevention layer)
14 Copper foil layer
15 Insulating layer constituting material
16 Supporting substrate
20 Build-up wiring layer
21 Supporting substrate with build-up wiring layer
30 Outer layer wiring
31 Housing recess
32 Passive components

The invention claimed is:

1. A manufacturing method of a multilayer printed wiring board employing a coreless build-up method using a copper foil with carrier foil, the manufacturing method comprising:
preparing the copper foil with carrier foil consisting of at least four layers, in the following order: a carrier foil/a release layer/a heat-resistant metal layer/a copper foil layer, and wherein the thickness of the carrier foil is greater than the thickness of the copper foil layer;
manufacturing a supporting substrate consisting of the copper foil with carrier foil and an insulating layer constituting material by laminating the insulating layer constituting material to the copper foil layer surface of the copper foil with carrier foil;
manufacturing a build-up wiring layer by forming the build-up wiring layer on the carrier foil surface in the supporting substrate;
manufacturing a multilayered laminate by separating the supporting substrate with the build-up wiring layer at the release layer in the supporting substrate, wherein the supporting substrate comprises the release layer, the heat-resistant metal layer, the copper foil, and the insulating layer, in this order; and
manufacturing the multilayer printed wiring board by processing the multilayered laminate.

2. The manufacturing method of a multilayer printed wiring board according to claim 1, wherein the copper foil with carrier foil is applied at least one or more treatment selected from a roughening treatment, a rust-proofing treatment and a coupling agent treatment on at least one surface of each of the carrier foil and the copper foil layer.

3. The manufacturing method of a multilayer printed wiring board according to claim 2, wherein the heat-resistant metal layer constituting the copper foil with carrier foil is formed by using nickel or a nickel alloy.

4. The manufacturing method of a multilayer printed wiring board according to claim 3, wherein the release layer constituting the copper foil with carrier foil is formed by using one or more of organic substance selected from the group consists of a nitrogen-containing organic compound, a sulfur-containing organic compound and a carboxylic acid.

5. The manufacturing method of a multilayer printed wiring board according to claim 2, wherein the release layer constituting the copper foil with carrier foil is formed by using one or more of organic substance selected from the group consists of a nitrogen-containing organic compound, a sulfur-containing organic compound and a carboxylic acid.

6. The manufacturing method of a multilayer printed wiring board according to claim 1, wherein the heat-resistant metal layer constituting the copper foil with carrier foil is formed by using nickel or a nickel alloy.

7. The manufacturing method of a multilayer printed wiring board according to claim 6, wherein the release layer constituting the copper foil with carrier foil is formed by using one or more of organic substance selected from the group consists of a nitrogen-containing organic compound, a sulfur-containing organic compound and a carboxylic acid.

8. The manufacturing method of a multilayer printed wiring board according to claim 1, wherein the release layer constituting the copper foil with carrier foil is formed by using one or more of organic substance selected from the group consists of a nitrogen-containing organic compound, a sulfur-containing organic compound and a carboxylic acid.

9. The manufacturing method of a multilayer printed wiring board according to claim 1, wherein the processing of the multilayered laminate comprises at least one of plating, etching and resist formation.

* * * * *